United States Patent [19]

Imamura et al.

[11] Patent Number: 5,600,276

[45] Date of Patent: Feb. 4, 1997

[54] INTEGRATED CIRCUIT COMPRISING A RESISTOR OF STABLE RESISTIVE VALUE

[75] Inventors: Makoto Imamura; Masahito Takagi, both of Tokyo, Japan

[73] Assignee: Yokogawa Electric Corporation, Tokyo, Japan

[21] Appl. No.: 661,133

[22] Filed: Jun. 10, 1996

Related U.S. Application Data

[63] Continuation of Ser. No. 423,331, Apr. 14, 1995, abandoned.

[30] Foreign Application Priority Data

Jun. 6, 1994 [JP] Japan ................................. 94123529

[51] Int. Cl.$^6$ ..................................................... G06G 7/12
[52] U.S. Cl. ........................................ 327/362; 327/308
[58] Field of Search ................................. 327/308, 328, 327/362, 427, 534, 535, 537; 257/318, 379, 380

[56] References Cited

U.S. PATENT DOCUMENTS

| | | | |
|---|---|---|---|
| 4,100,437 | 7/1978 | Hoff, Jr. | 327/537 |
| 4,224,539 | 9/1980 | Musa et al. | 327/535 |
| 4,663,584 | 5/1987 | Okada et al. | 327/537 |
| 4,686,451 | 8/1987 | Li et al. | 327/537 |
| 4,968,901 | 11/1990 | Shacter | 327/308 |
| 5,065,132 | 11/1991 | Taddiken et al. | 257/379 |
| 5,331,194 | 7/1994 | Veno | 257/379 |
| 5,479,045 | 12/1995 | Narahara et al. | 257/379 |

OTHER PUBLICATIONS

Sedra & Smith, "Microelectronic Circuits", Saunders College Publishing, Philadelphia 1991, p. 323.

*Primary Examiner*—Timothy D. Callahan
*Assistant Examiner*—Jeffrey Zweizig
*Attorney, Agent, or Firm*—Moonray Kojima

[57] ABSTRACT

An improved semiconductor integrated circuit comprising a substrate, at least one first semiconductor resistor, and at least one second semiconductor resistor, with the the first and second resistors defining a resistance ratio, and a boot-strap electrode at a desired potential, wherein variation in resistance value of the first resistor is determined by the potential difference between the first resistor and the substrate, and variation in resistance value of the second resistor is determined by the potential at the boot-strap electrode, and wherein the variation in the resistance value of the second resistor acts to cancel out the variation in the first resistor resistance value, whereby an accurate device is produced by the invention.

17 Claims, 4 Drawing Sheets

INTEGRATED CIRCUIT COMPRISING A RESISTOR OF STABLE RESISTIVE VALUE

This application is a continuation of Ser. No. 08/423,331, filed Apr. 16, 1995, now abandoned.

BACKGROUND OF THE INVENTION

1. Field of Invention

This invention relates to an integrated circuit formed by a semiconductor; and more particularly, to an integrated circuit wherein errors due to variations in resistance values of semiconductor resistances, such as polysilicon resistors and diffused resistors, are suppressed.

2. Description of the Prior Art

It was once though that the resistance value of a polysilicon resistor, which is an integrated circuit formed of a semiconductor, does not depend on the applied electric field, or other factor; and, thus is suited for an accurate electric circuit. However, as pointed out by Y. Akazawa and A. Iwata in "Recent Trends in High performance A-D and D-A conversion LSI", NTT R & D, Vol. 39, Nov. 1, 1990, pp 55–64, resistance value varies depending on the interelectrode voltage. The effect of the resistance variation can be reduced by reducing the voltage applied per unit length of the resistor. In a circuit whose characteristics are determined by the ratio of one resistance part to the remaining resistance part, such as an attenuator, resistance variations produce no effects and so no great problem occurs.

However, the inventors hereof have experimentally discovered that the resistance value changes according to the potential difference with the substrate. This is an impediment to realization of an accurate electric circuit.

SUMMARY OF THE INVENTION

Accordingly, it is an object of the invention to overcome the aforementioned and other deficiencies and disadvantages of the prior art.

Another object is to provide an accurate integrated circuit wherein variations in resistance values of semiconductor resistors are cancelled out.

DETAILED DESCRIPTION OF THE PREFERRED EMBODIMENTS

CURRENT-VOLTAGE CONVERTER

Figure 1:
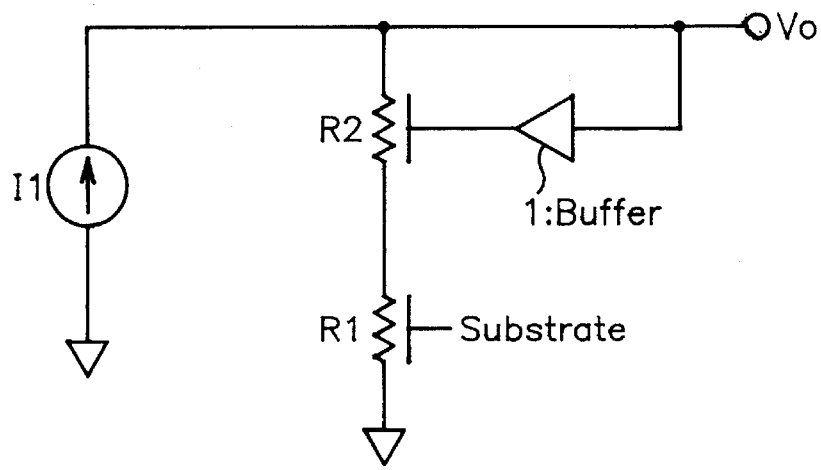
FIG. 1 is a circuit diagram depicting an illustrative embodiment of the invention comprising a current-voltage converter.

FIG. 1 shows a current-voltage converter formed of an integrated circuit. The converter comprises a polysilicon resistor R1 which forms a first semiconductor resistor. One end of resistor R1 is grounded. The variation in resistance value of resistor R1 is determined by the potential difference with the substrate. The current-voltage converter further comprises a polysilicon resistor R2 which forms a second semiconductor resistor. One end of resistor R2 is connected to the other end of resistor R1. Resistor R2 cooperates with resistor R1 to define a resistance ratio. Resistor R2 is placed at a desired potential, which determines the variation in resistance value. The resistance value variation cancels out the variation in resistance value of resistor R1. The other end of resistor R2 constitutes an output end of the converter which outputs an output voltage VO of a desired potential. Resistors R1 and R2 have the same resistance value. The current-voltage converter further comprises a current source $I_1$ having one end thereof grounded and another end thereof being connected to the other end of resistor R2. A buffer 1 is connected to the other end of resistor R2 to receive as an input voltage, the voltage developed at the output terminal. The buffer 1 applies the input voltage across an isolation diffusion part which is formed under resistor R2 via an insulation layer comprising, for example, an oxide. The input voltage applied across the isolation diffusion part acts to cancel out the variation in resistance value of resistor R1.

Figure 2:
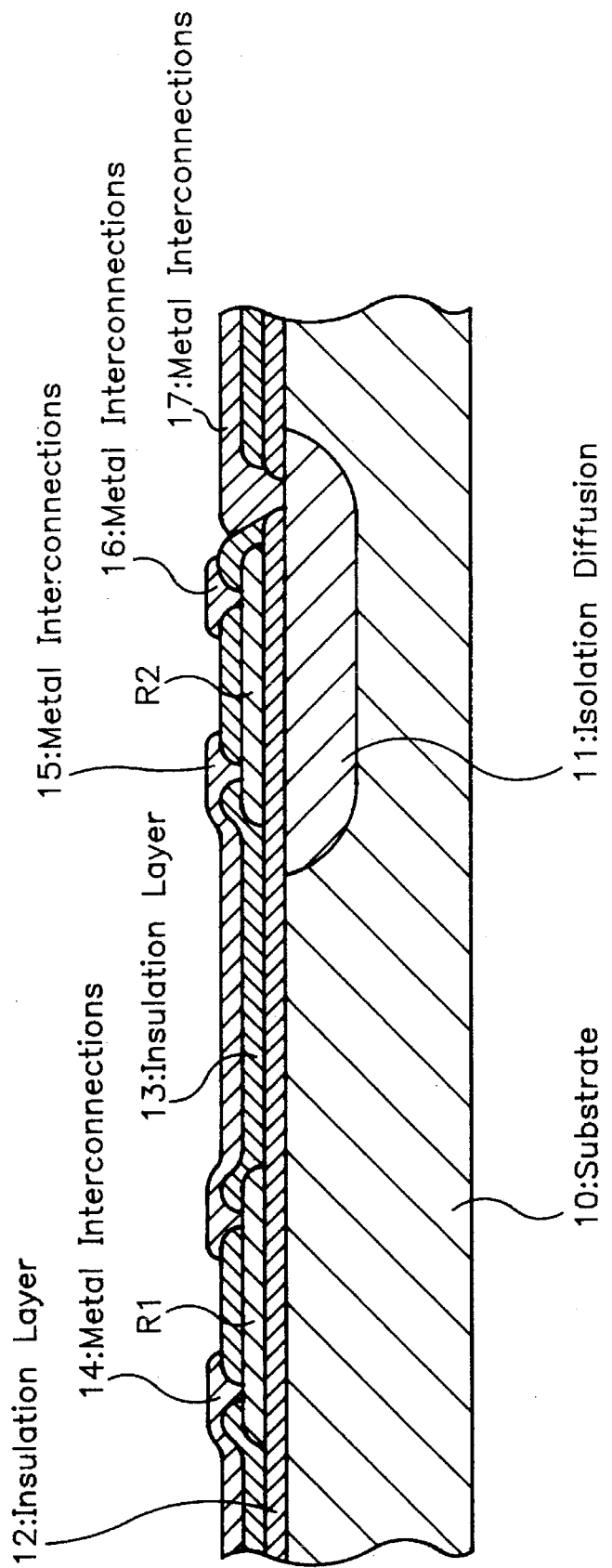
FIG. 2 is a cross-sectional view depicting polysilicon resistors included An the converter of FIG. 1.

Resistors R1 and R2 of the device of FIG. 1 are next described with reference to FIG. 2, wherein an isolation diffusion part 11 is shown forming a part of substrate 10. An insulation layer 12 is formed so as to cover both substrate 10 and isolation diffusion part 11. Resistor R1 is formed over substrate 10 via insulation layer 12. Resistor R2 is formed over isolation diffusion part 11 via insulation layer 12. Another insulation layer 13 is formed so as to cover insulation layer 12 and resistor R1 and R2.

Metal interconnections 14–17 are made, for example, of aluminum or the like, and are formed on insulation layer 13. Interconnection 14 is connected to resistor R1 and grounded. Interconnection 15 interconnects resistors R1 and R2. Interconnection 16 connects resistor R2 to current source $I_1$ (shown in FIG. 1) and forms the output terminal of the converter of FIG. 1. Interconnection 17 connects isolation diffusion part 11 to buffer 1.

The operation of the FIG. 1 device is as follows.

A first comparison case is first described comprising two polysilicon/resistors R1 and R2 formed on semiconductor substrate 10, but in which the isolation diffusion part 11 is not formed.

On average, resistors R1 and R2 undergo potentials of "$\frac{1}{4} \cdot V_O - V_{sub}$" and "$\frac{3}{4} \cdot V_O - V_{sub}$", respectively, from subtrate 10. The resistance value varies in proportion to the potential difference with substrate 10. Let $\alpha$ be the proportional coefficient, then, the sum of resistance values of resistors R1 and R2 are given by:

$$R[1+\alpha(\tfrac{1}{4}\cdot V_O-V_{sub})]+R[1+\alpha(\tfrac{3}{4}\cdot V_O-V_{sub})]=R[2+\alpha(V_O-2V_{sub})]$$

wherein $V_O$ is the output voltage from the current-voltage converter, $V_{sub}$ is the voltage of substrate 10, and R is the resistance value of resistors R1 and R2.

As described above, the output voltage $V_O$ varies the resistance value and deteriorates the accuracy of the resistors.

In contrast to the first comparison case, the invention is next described wherein polysilicon resistor R2 is formed as a resistor on an isolation diffusion part 11.

The invention is similar to the first comparison case, except that the resistance value of the resistor R2 is determined either by the voltage $V_{sub}$ of substrate 10, or by the voltage $V_{epi}$ of isolation diffusion part 11. Voltage $V_{epi}$ is determined by the voltage applied from buffer 1, and thus, is equal to the output voltage $V_o$. Thus, the total resistance value is given by:

$$R[1 + \alpha(1/4 \cdot V_o - V_{sub})] + R[1 + \alpha(3/4 \cdot V_o - V_{epi})] =$$

$$R[1 + \alpha(1/4 \cdot V_0 - V_{sub})] + R[1 + \alpha(3/4 \cdot V_o - V_o)] =$$

$$R[1 + \alpha(-V_{sub})]$$

It follows that the total resistance value of resistors R1 and R2 is determined by the potential at substrate 10. Since the total resistance value is not affected by the output voltage $V_0$, the resistance value remains the same. Thus, the invention produces an accurate current-voltage converter.

INVERTING AMPLIFIER

Figure 3:
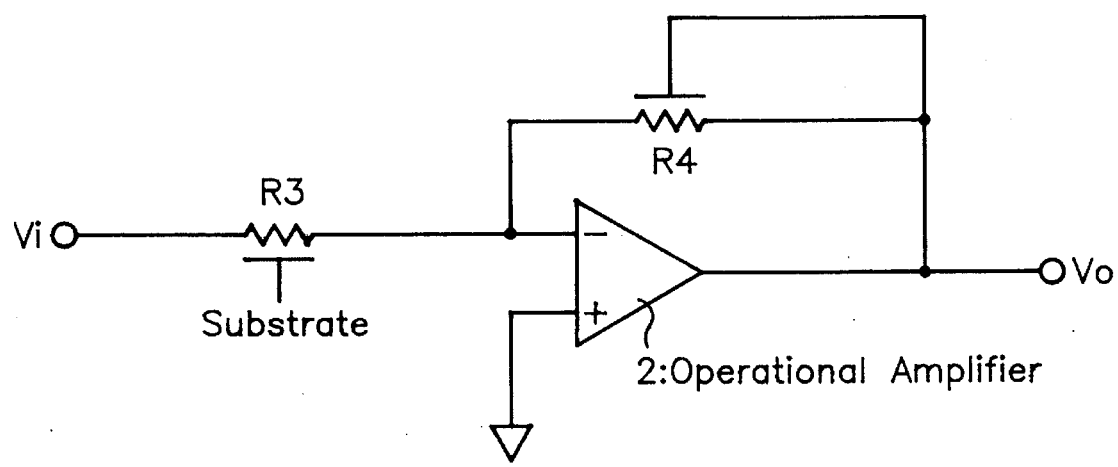
FIG. 3 is a circuit diagram depicting a second illustrative embodiment comprising an inverting amplifier.

FIG. 3 shows an inverting applifier comprising a polysilicon resistor R3 which forms a first semiconductor resistor having one end thereof to which an input voltage $V_i$ is applied. The potential difference between resistor R3 and the substrate determines the variation in the resistance value. A polysilicon resistor R4 forms a second semiconductor resistor having one end thereof connected to the other end of resistor R3. Resistor R4 cooperates with resistor R3 to form a resistance ratio. Resistor R4 is placed at a desired potential, which determines the variation in the resistance value. The resistance value variation cancels out the variation in the resistance value of resistor R3. Resistors R3 and R4 have the same resistance value.

An operational amplifier 2 has a positive terminal grounded and a negative terminal connected to the other end of resistor R3. The output terminal of amplifier 2 is connected to the other end of resistor R4. Amplifier 2 produces an output voltage $V_0$ of a desired potential, which is applied across an isolation diffusion part which is formed under resistor R4 via an insulation layer.

Resistors R3 and R4 are similar to resistors R1 and R2, except as follows. In FIG. 2, resistors R1 and R2 are replaced by resistors R3 and R4, respectively. Metal interconnection 14 receives input voltage $V_i$ instead of being grounded. Metal interconnection 15 is also connected to the negative terminal of amplifier 2. Metal interconnections 16 and 17 are connected to the output terminal of amplifier 2 instead of being connected to current source $I_1$.

The device operates as follows:

A second comparison case is first described wherein resistor R4 is also formed on substrate 10, i.e. resistor R4 is not formed on the isolation diffusion part 11. It is assumed that resistors R3 and R4 have the same resistance value as resistors R1 and R2, and that the other values are the same as the values of the corresponding items in the device of FIGS. 1 and 2.

On the average, the potential differences of resistors R3 and R4 with substrate 10, are "½·$V_i$−$V_{sub}$" and "½·$V_0$− $V_{sub}$", respectively. Since resistors R3 and R4 have the same resistance value, "$V_0$=−$V_i$". Because α is sufficiently small, it is assumed that "1+[α$V_i$/(½·$V_i$−$V_{sub}$)]≈1". The output voltage $V_0$is given by the following:

$$V_0 \approx V_i \cdot [R\{1+\alpha(-½·V_i-V_{sub})\}]/[R\{1+\alpha(½·V_i-V_{sub})\}] \approx -V_i(1+\alpha V_i)$$

Although the circuit makes use of the resistance ratio as described above, the input voltage $V_i$ varies the resistance ratio and deteriorates the accuracy of the inverting amplifier.

The invention is compared to the second comparison case, wherein the invention differs from the second comparison case in that the resistance value of resistor R4 is determined by either the voltage $V_{sub}$ of substrate 10 or voltage $V_{epi}$ applied across the isolation diffusion part 11 in the same manner as in FIG. 1. Utilizing "$V_{epi}$=$V_0$≈−$V_i$", approximations are made in the same manner as the foregoing. Thus, the output voltage $V_0$ is given by:

$$V_026 -V_i \cdot [R\{1+\alpha(-½·V_i+V_i)\}]/[R\{1+\alpha(½·V_{sub})\}] \approx -V_i(1+\alpha V_{sub})$$

Since the resistance ratio is determined by the voltage $V_{sub}$ of substrate 10, the invention produces an accurate inverting amplifier which is not affected by the input voltage $V_i$. Also, where the gain is other than "−1", an accurate inverting amplifier can be achieved by applying such a voltagae to the isolation diffusion part 11, which is obtained by dividing the output voltage $V_0$ from amplifier 2. Alternatively, the feedback resistor is divided into plural parts of the same resistance value or by the ratio of resistance values. Furthermore, the polysilicon resistor forming the first semiconductor resistor formed on the substrate and the polysilicon resistor forming the second semiconductor resistor formed on the isolation diffusion part can be formed at this division ratio so that an accurate inverting applifier is achieved.

For example, where he gain is "−2N−1", wherein N is a natural number, the voltage applied across the isolation diffusion part 11 is set to "$V_0$·(N+1)/(2N+1)". Alternatively, (2N+1) polysilicon resistors acting as feedback resistors are provided. The polysilicon resistors have the same resistance values. From the polysilicon resistors, (N+1) resistors are formed on the isolation diffusion part, and output voltage $V_0$ is applied across the isolation diffusion part. The remaining N resistors are formed on the substrate.

ATTENUATOR

Figure 4:
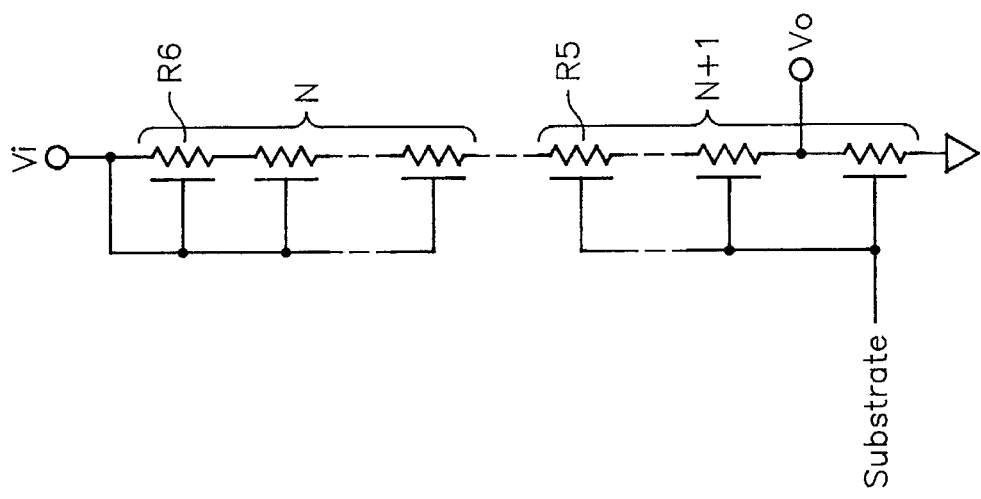
FIG. 4 is a circuit diagram depicting a third illustrative embodiment comprising an attenuator.

FIG. 4 shows an attenuator, wherein (N+1) polysilicon resistors R5 form first semiconductor resistors. The difference in potential between each resistor R5 and substrate determines the variation in resistance value. One end of one of the resistors R5 is grounded and the output voltage $V_0$ is produced at the other end. Other resistors are connected in series with the other end. N polysilicon resistors R6 form second semiconductor resistors and cooperate with resistor R5 to form a resistance ratio.

Resistor R6 is placed at the potential of the input voltage $V_i$. This potential determines the variation in resistance value of resistor R6. The variation in resistance value cancels out the variation in resistance value of resistor R5. Input voltage $V_i$ is applied to one end of one of resistors R6. The other resistors R6 are connected in series with the other end. The terminal of resistor R5, connected in series, is connected with the terminal of resistors R6, which are connected in series also. Each of resistors R5 and R0 has the same resistance value. By so constructing the device, the variations in the resistance values of the resistors are cancelled out. As a result, an accurate attenuator is attained by the invention.

CURRENT-VOLTAGE CONVERTER

Figure 5:
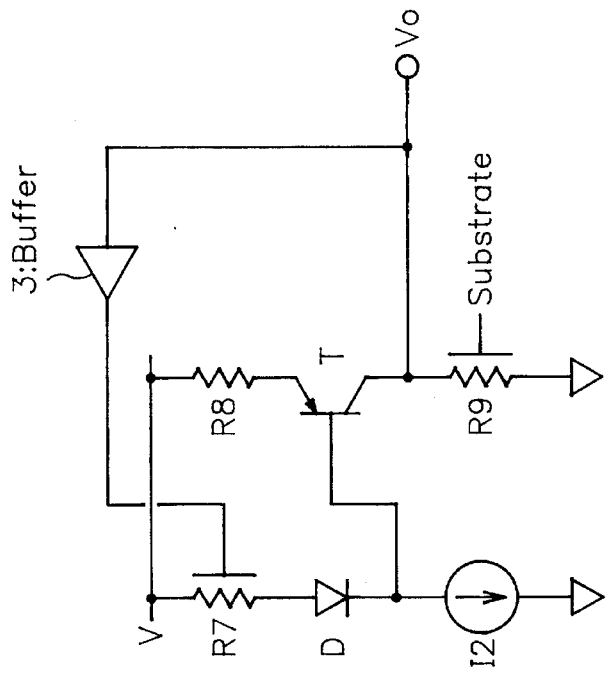
FIG. 5 is a circuit diagram depicting a fourth illustrative embodiment comprising another current-voltage converter.

FIG. 5 shows a current-voltage converter wherein the first semiconductor resistor is not connected in series with the second semiconductor resistor. In FIG. 5, a polysilicon resistor R7 forms a second semiconductor resistor. A voltage V is applied to one end of resistor R7, while the other end is grounded via a diode D and a current source 12. Resistor R7 is placed at a desired potential, which determines the variation in the resistance value. The cathode of diode D is connected to the base of a transistor T. Voltage V is applied to the emitter of transistor T via a polysilicon resistor R8.

A polysilicon resistor R9 forms a first semiconductor resistor having one end thereof connected to the collector of transistor T and the other end thereof being grounded. Resistor R9 cooperates with resistor R7 to form a resistance ratio. The potential difference between resistor R9 and the substrate determines the variation in the resistance value. The variation in resistance value of resistor R9 is cancelled out by the variation in resistance value of resistor R7. An output voltage $V_0$ is developed at one end of resistor R9. A buffer 3 receives the output voltage $V_0$ and delivers a potential applied across isolation diffusion part which is formed under resistor R7 via an insulation layer. Resistor R8 is also formed over the substrate via the insulation layer.

In FIG. 5, resistor R7 is connected to resistor R9 via diode D and transistor T. Resistor R7 and R9 together form a resistance ratio. Thus, the variation in resistance value of resistor R9 is cancelled out by resistor R7 resistance variation.

In this manner, the variation in the resistance value of the first semiconductor resistor is cancelled out by applying a potential to the second semiconductor resistor so as to vary the resistance value of the second semiconductor resistor. Hence, an accurate resistor is formed by the invention.

Moreover, the proportional coefficients of the variations in the resistors are the same because the first and second semiconductor resistors are formed on the same insulation layer. Consequently, the potential applied to the second semiconductor can be easily found. Also, in the invention, an accurate resistor can be fabricated from semiconductor resistors without using thin-film resistors. Accordingly, the semiconductor fabrication process can be performed at low cost.

In the invention, the variation in resistance value of the first semiconductor resistance is cancelled out by the variation in resistance value of the second semiconductor resistor. However, the following structure may also be used.

Figure 6:
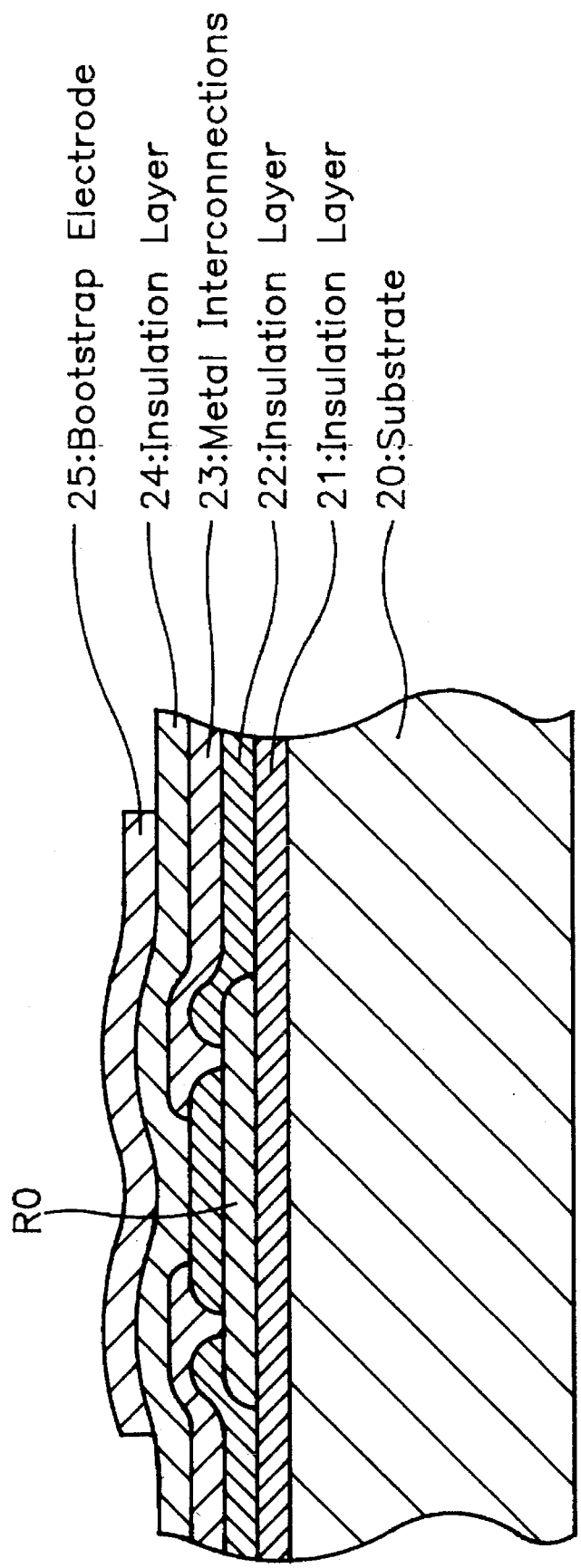
FIG. 6 is a cross-sectional view depicting a fifth illustrative embodiment of the invention.

FIG. 6 shows an insulation layer 21 formed so as to cover a substrate 20. A polysilicon resistor R0 is a semiconductor resistor and is formed over substrate 20 via insulation layer 21. Another insulation layer 22 is formed so as to cover both resistor R0 and insulation layer 21. Metal interconnection 23 is made of aluminum (as are the other interconnections) and is formed on insulation layer 22. Interconnection 23 connects resistor R0 to other electrical devices (not shown). Another insulation layer 24 is formed so as to cover insulation layer 22 and interconnection 23. A bootstrap electrode 25 covers resistor R0 via insulation layer 24 and applies a potential difference to resistor R0, to cancel out the variation in resistance value of resistor R0.

The FIG. 6 device operates as follows. In the same manner as the foregoing, the voltage applied across resistor R0 varies because of the relations between electrical components and resistor R0. Concurrently, the potential difference between resistor R0 and substrate 20 varies, thus changing the resistance value of resistor R0. A voltage corresponding to the variation in resistance value is applied to boot-strap electrode 25. The variation in resistance value of resistor R0 caused by the potential difference between resistor R0 and substrate 20 is cancelled out by the variation in the resistance value of resistor R0 due to the potential difference between resistor R0 and boot-strap electrode 25. As a result, an accurate resistor is attained by the invention.

Moreover, an accurate resistor is attained by using semiconductor resistors without use of thin-film techniques, as in the foregoing embodiments. Thus, in the invention, the semiconductor fabrication process is performed at low cost.

The invention is not limited to the case where variation in resistance value caused by the potential difference between resistor R0 and substrate 20 is cancelled out by the potential at bootstrap electrode 25. For example, where a voltage is applied to an isolation layer formed on a substrate, in the same manner as in FIG. 2, to maintain constant the potential difference with the semiconductor resistor, is one case. In that case, similar advantages as in FIG. 2 can be obtained.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. An integrated circuit comprising:
   a semiconductor substrate having a substantially flat surface;
   at least one first polysilicon resistor formed on said substantially flat surface of said substrate and having between two points thereof a first resistance value with a first component; and
   means for applying an electrical signal to said substrate of a suitable value and so as to cause cancellation of said first component of said first resistance value.

2. The device of claim 1, wherein said at least one first polysilicon resistor is formed over a substrate via an insulation layer, and wherein at least one second polysilicon resistor is formed over an isolation diffusion part lying on a substrate via an insulation layer which is used as said electrode.

3. The device of claim 2, wherein said at least one first and second polysilicon resistors together form a current-voltage converter.

4. The device of claim 3, wherein a potential applied across said isolation diffusion part is used as an output potential produced from said current-voltage converter.

5. The device of claim 2, wherein said at least one first and second polysilicon resistors together form an amplifier.

6. The device of claim 5, wherein said potential is applied to said isolation diffusion part by making use of a potential produced by said amplifier.

7. The device of claim 2, wherein said at least one first and second polysilicon resistors together form an attenuator.

8. The device of claim 7, wherein a potential is applied across said attenuator and is applied across said isolation diffusion parts as said potential.

9. The device of claim 8, wherein (N+1) said first polysilicon resistors are connected in series to each other; N said second polysilicon resistors are connected in series to each other; and wherein said first and second polysilicon resistors are connected in series with each other; and said first and second polysilicon resistors together form an attenuator for attenuating a voltage applied to said polysilicon resistors by a factor of $1/(2N+1)$.

10. The circuit of claim 1, wherein at least one second polysilicon resistor is formed on said substantially flat surface of said substrate, and said at least one first polysilicon resistor and said at least one second polysilicon resistor cooperate to define a resistance ratio, and wherein said means for applying comprises an electrode disposed on said substrate, and means for applying said electrical signal to said electrode so as to cause a component of a second resistance value of said second polysilicon resistor to cancel said first component of said first resistance value.

11. An integrated circuit made of a semiconductor, said integrated circuit comprising:
    a semiconductor substrate;
    at least one polysilicon resistor formed on said substrate, said polysilicon resistor having a resistance value between two points along a direction parallel to said substrate, said resistance value having a first component; and an electrode means connected to said substrate for applying a signal to said substrate to thereby cause suppression of said first component of said resistance value of said polysilicon resistor.

12. The circuit of claim 11, wherein said electrode means comprises an isolation diffusion part formed on or in said substrate.

13. The circuit of claim 11, wherein an insulation layer is formed on top of said polysilicon resistor, and said electrode means comprises an electrode which covers said insulation layer.

14. In a semiconductor integrated circuit, a resistor ratio compensating circuit comprising:

- at least one first polysilicon resistor having an error component of a resistance value which is varied according to a potential difference between said first polysilicon resistor and a substrate;
- an electrode placed at a desired potential; and
- at least one second polysilicon resistor cooperating with said at least one first polysilicon resistor to define a resistance ratio, said at least one second polysilicon resistor being formed on said electrode with said potential determining a variation in resistance value of said at least one second polysilicon resistor, whereby said at least one second polysilicon resistor acting to cancel said error component of said resistance value of said at least one first polysilicon resistor.

15. In an integrated circuit, a resistor compensating circuit comprising:

- at least one polysilicon resistor formed on a substrate; and
- an electrode means for applying a signal to substantially cancel any error in resistance value of said at least one polysilicon resistor.

16. The circuit of claim 15, wherein said electrode means comprises an isolation diffusion part formed on or in said substrate.

17. The circuit of claim 15, wherein said electrode means covers said polysilicon resistor with an insulation layer therebetween.

* * * * *